_(12)_ United States Patent
Liao

(10) Patent No.: US 9,754,932 B2
(45) Date of Patent: Sep. 5, 2017

(54) SEMICONDUCTOR DEVICE

(71) Applicant: DELTA ELECTRONICS, INC., Taoyuan (TW)

(72) Inventor: Wen-Chia Liao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/933,059

(22) Filed: Nov. 5, 2015

(65) Prior Publication Data

US 2017/0025406 A1    Jan. 26, 2017

(30) Foreign Application Priority Data

Jul. 21, 2015 (TW) .............................. 104123517 A

(51) Int. Cl.
| | | |
|---|---|---|
| *H01L 27/108* | (2006.01) | |
| *H01L 27/06* | (2006.01) | |
| *H01L 29/778* | (2006.01) | |
| *H01L 29/20* | (2006.01) | |
| *H01L 29/205* | (2006.01) | |
| *H01L 29/15* | (2006.01) | |

(52) U.S. Cl.
CPC ........ *H01L 27/0629* (2013.01); *H01L 29/155* (2013.01); *H01L 29/2003* (2013.01); *H01L 29/205* (2013.01); *H01L 29/7787* (2013.01)

(58) Field of Classification Search
CPC .................................................. H01L 27/0629
USPC .................................................... 257/24, 296
See application file for complete search history.

(56) References Cited

U.S. PATENT DOCUMENTS

| | | | |
|---|---|---|---|
| 2011/0193619 A1* | 8/2011 | Parikh ................. | H01L 21/8258 327/534 |
| 2012/0262220 A1 | 10/2012 | Springett | |
| 2013/0009165 A1 | 1/2013 | Park et al. | |
| 2013/0257539 A1* | 10/2013 | Kotani ................ | H01L 29/2003 330/277 |
| 2014/0009131 A1 | 1/2014 | Shilimkar et al. | |
| 2014/0091311 A1* | 4/2014 | Jeon ...................... | H01L 29/205 257/76 |
| 2014/0091845 A1 | 4/2014 | Then et al. | |

FOREIGN PATENT DOCUMENTS

| | | |
|---|---|---|
| CN | I957474 | 5/2007 |
| TW | I344205 | 6/2011 |
| TW | 201445742 | 12/2014 |

* cited by examiner

*Primary Examiner* — Ajay K Arora
(74) *Attorney, Agent, or Firm* — Hauptman Ham, LLP

(57) ABSTRACT

A semiconductor device includes a substrate, an active layer, a transistor, and a capacitor. The active layer is disposed on the substrate, and the active layer is divided into a first portion and a second portion. The transistor and the capacitor are disposed on the substrate. The transistor includes the second portion, a source electrode, a drain electrode, and a gate electrode. The source electrode and the drain electrode are respectively and electrically connected to the second portion. The gate electrode is disposed on the second portion. The capacitor includes the first portion, a first electrode, a first insulating layer, and a second electrode. The first electrode is electrically connected to the first portion and the source electrode. The first insulating layer is disposed on the first portion. The second electrode is disposed on the first insulating layer and is electrically connected to the gate electrode.

8 Claims, 2 Drawing Sheets

SEMICONDUCTOR DEVICE

RELATED APPLICATIONS

This application claims priority to Taiwan Application Serial Number 104123517, filed Jul. 21, 2015, which is herein incorporated by reference.

BACKGROUND

Field of Invention

The present disclosure relates to a semiconductor device.

Description of Related Art

As a form of a field effect transistor (FET), a high electron mobility transistor (HEMT) is widely used in the art because of its high electron mobility and low resistance. The key element within a HEMT is a heterojunction formed by two materials with different band gaps instead of a pn-junction used in the conventional FET. A commonly used material combination is aluminum gallium nitride (AlGaN) and gallium nitride (GaN). Since the heterojunction created by AlGaN and GaN forms a quantum well in the conduction band on the GaN side, a two-dimensional electron gas (2 DEG) appears at the interface of AlGaN and GaN.

SUMMARY

An aspect of the present disclosure is to provide a semiconductor device including a substrate, an active layer, a transistor, and a capacitor. The active layer is disposed on the substrate, and the active layer is divided into a first portion and a second portion. The transistor is disposed on the substrate, and the transistor includes the second portion of the active layer, a source electrode, a drain electrode, and a gate electrode. The source electrode and the drain electrode are respectively and electrically connected to the second portion. The gate electrode is disposed on the second portion and is disposed between the source electrode and the drain electrode. The capacitor is disposed on the substrate, and the capacitor includes the first portion of the active layer, a first electrode, a first insulating layer, and a second electrode. The first electrode is electrically connected to the first portion and the source electrode of the transistor. The first insulating layer is disposed on the first portion. The second electrode is disposed on the first insulating layer and is electrically connected to the gate electrode of the transistor.

In one or more embodiments, the first electrode, the source electrode, and the drain electrode are made of substantially the same material.

In one or more embodiments, the second electrode and the gate electrode are made of substantially the same material.

In one or more embodiments, the first insulating layer is made of aluminum oxide.

In one or more embodiments, the transistor further includes a second insulating layer disposed between the gate electrode and the second portion of the active layer.

In one or more embodiments, the first insulating layer and the second insulating layer are made of substantially the same material.

In one or more embodiments, the semiconductor device further includes an isolation portion disposed in the active layer and between the first portion and the second portion.

In one or more embodiments, the active layer is further divided into a third portion, and the semiconductor device further includes a resistor disposed on the substrate and electrically connected to the capacitor. The resistor includes the third portion of the active layer, a third electrode, and a fourth electrode. The third electrode is electrically connected to the third portion. The fourth electrode is electrically connected to the third portion.

In one or more embodiments, the third electrode is connected to the second electrode of the capacitor.

In one or more embodiments, the active layer includes a channel layer and a barrier layer. The channel layer is disposed on the substrate. The barrier layer is disposed on the channel layer. The barrier layer has a recess to expose the channel layer, and the third electrode is disposed in the recess and is spaced from the barrier layer.

In one or more embodiments, the first electrode, the third electrode, and the fourth electrode are made of substantially the same material.

DETAILED DESCRIPTION

Figure 1:
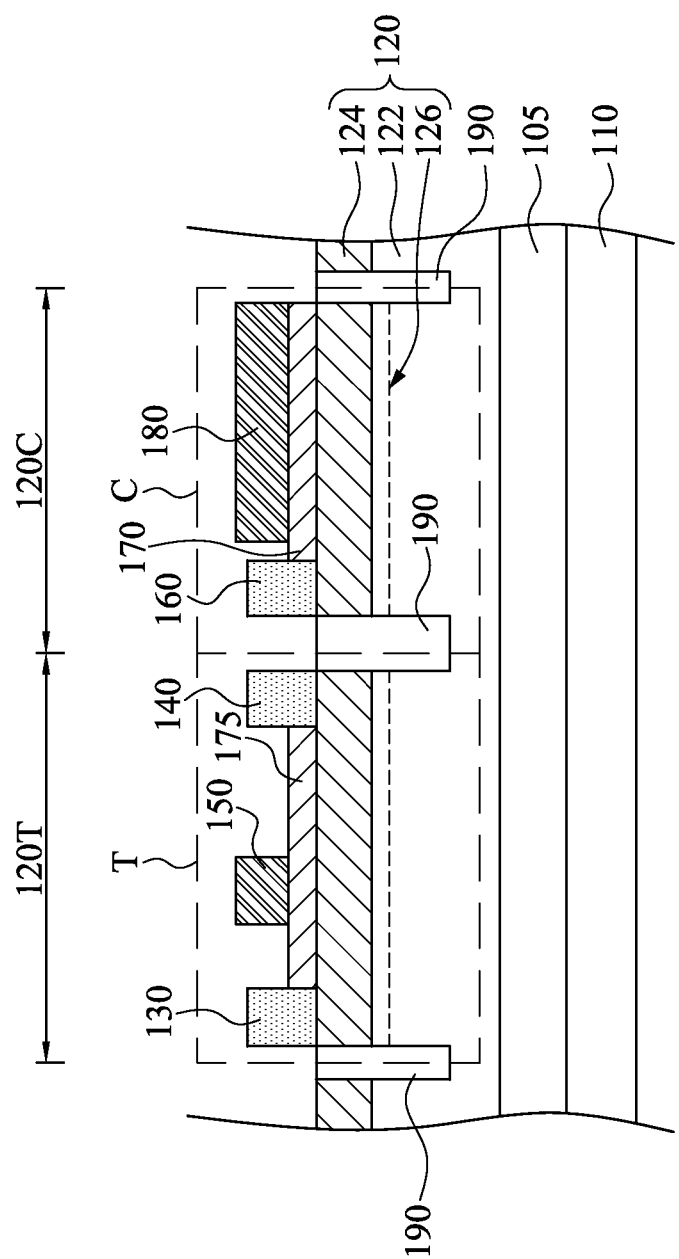
FIG. 1 is a cross-sectional view of a semiconductor device according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor device according to one embodiment of the present disclosure. The semiconductor device includes a substrate 110, an active layer 120, a transistor T, and a capacitor C. The active layer 120 is disposed on the substrate 110, and the active layer 120 is divided into a first portion 120C and a second portion 120T. The transistor T is disposed on the substrate 110, and the transistor T includes the second portion 120T of the active layer 120, a source electrode 130, a drain electrode 140, and a gate electrode 150. The source electrode 130 and the drain electrode 140 are respectively and electrically connected to the second portion 120T. For example, the source electrode 130 and the drain electrode 140 are respectively disposed on the active layer 120. The gate electrode 150 is disposed on the second portion 120T and is disposed between the source electrode 130 and the drain electrode 140. The capacitor C is disposed on the substrate 110, and the capacitor C includes the first portion 120C of the active layer 120, a first electrode 160, a first insulating layer 170, and a second electrode 180. The first electrode 160 is electrically connected to the first portion 120C and the source electrode 130 of the transistor T. In some embodiments, the first electrode 160 can be electrically connected to the source electrode 130 through external circuits or interlayer vias, and the claimed scope is not limited in this respect. The first insulating layer 170 is disposed on the first portion 120C of the active layer 120. The second electrode 180 is disposed on the first insulating layer 170 and is electrically connected to the gate electrode 150 of the transistor T. In some embodiments, the second electrode 180 can be electrically connected to the gate electrode 150 through external circuits or interlayer vias, and the claimed scope is not limited in this respect. The semiconductor device further includes an isolation portion 190 disposed in the active layer 120 and between the first portion 120C and the second portion 120T.

The present embodiment can increase gate-source capacitance (Cgs) of the transistor T by using the capacitor C. More specifically, in this embodiment, since the first electrode 160 of the capacitor C is electrically connected to the source electrode 130 of the transistor T, and the second electrode 180 of the capacitor C is electrically connected to the gate electrode 150 of the transistor T, the transistor T is equivalent to be added a capacitance between the gate electrode 150 and the source electrode 130, such that the Cgs of the semiconductor device is increased, and the Miller ratio, which is inversely proportional to the Cgs, of the semiconductor device can be reduced. Once the Miller ratio is reduced, the operational performance of the semiconductor device is improved to achieve high frequency operations and minimize shoot-through currents.

In this embodiment, the active layer 120 includes a plurality of nitride-based semiconductor layers to form two-dimensional electron gases (2 DEG) 126, which is configured to a conductive channel, at the heterojunction thereof. For example, a channel layer 122 and a barrier layer 124 stacked together can be used. The channel layer 122 is disposed on or above the substrate 110, and the barrier layer 124 is disposed on the channel layer 122. With such configuration, the 2 DEG 126 can exist at the interface of the channel layer 122 and the barrier layer 124. In some embodiments, the channel layer 122 can be a gallium nitride (GaN) layer, and the barrier layer 124 can be an aluminum gallium nitride (AlGaN) layer.

In this embodiment, the first electrode 160 is electrically connected to the 2 DEG 126. That is, the first electrode 160 and the 2 DEG 126 have the same potential value. Through the isolation of the barrier layer 124 and the first insulating layer 170, a capacitance is formed between the second electrode 180 and the 2 DEG 126, and the capacitance value depends on the area that the second electrode 180 covers the active layer 120 and the thickness of the first insulating layer 170.

For the transistor T, when the semiconductor device is at the on-state, the current between the source electrode 130 and the drain electrode 140 can flow along the interface of the channel layer 122 and the barrier layer 124. Furthermore, the substrate 110 can be a silicon substrate or a sapphire substrate, and the claimed scope of the present disclosure is not limited in this respect. In the present embodiment, the semiconductor device can further include a buffer layer 105 disposed between the active layer 120 and the substrate 110. Moreover, the isolation portion 190 can avoid leakage current and increase breaking-down voltage.

Another improvement of the semiconductor device of the present disclosure is the transistor T and the capacitor C can be formed together under the present manufacturing process, and additional process can be omitted. More specifically, in this embodiment, the first electrode 160, the source electrode 130, and the drain electrode 140 can be made of substantially the same material. For example, a conductive layer can be formed and patterned to form the first electrode 160, the source electrode 130, and the drain electrode 140. In some embodiments, the first electrode 160, the source electrode 130, and the drain electrode 140 can respectively be ohmic contacted to the active layer 120, and the claimed scope of the present disclosure is not limited in this respect.

Moreover, in this embodiment, the second electrode 180 and the gate electrode 150 can be made of substantially the same material. For example, another conductive layer can be formed and patterned to form the second electrode 180 and the gate electrode 150. In some embodiments, conductive layer can be a metal layer, and the claimed scope of the present disclosure is not limited in this respect.

In this embodiment, the semiconductor device further includes a second insulating layer 175 disposed between the gate electrode 150 and the second portion 120T of the active layer 120. In some embodiments, the thickness of the second insulating layer 175 can be about 10 nm, and the clamed scope of the present disclosure is not limited in this respect.

In this embodiment, the first insulating layer 170 and the second insulating layer 175 can be made of substantially the same material. For example, a dielectric layer can be formed and patterned to form the first insulating layer 170 and the second insulating layer 175. In some embodiments, the material of the dielectric layer can be $SiO_2$, $SiN_x$, $Ga_2O_3$, $Al_2O_3$, $Gd_2O_3$, $Hf_2O_3$, AlN, or combinations thereof.

In summary, since in this embodiment, the first electrode 160, the source electrode 130, and the drain electrode 140 can be made in the same manufacturing process, i.e., the first electrode 160, the source electrode 130, and the drain electrode 140 are made of substantially the same material, the second electrode 180 and the gate electrode 150 are made in the same manufacturing process, i.e., the second electrode 180 and the gate electrode 150 can be made of substantially the same material, and the first insulating layer 170 and the second insulating layer 175 can be made in the same manufacturing process, i.e., the first insulating layer 170 and the second insulating layer 175 are made of substantially the same material, the transistor T and the capacitor C can be manufactured together without additional process to save cost and manufacturing time.

However, in some other embodiments, the transistor T may have different structure from the structure of FIG. 1. Basically, an embodiment fall within the claimed scope of the present disclosure as long as the first electrode 160 of the capacitor C is electrically connected to the source electrode 130 of the transistor T and the second electrode 180 is electrically connected to the gate electrode 150 of the transistor T to form the capacitance (Cgs) between the source electrode 130 and the gate electrode 150 of the transistor T.

Figure 2:
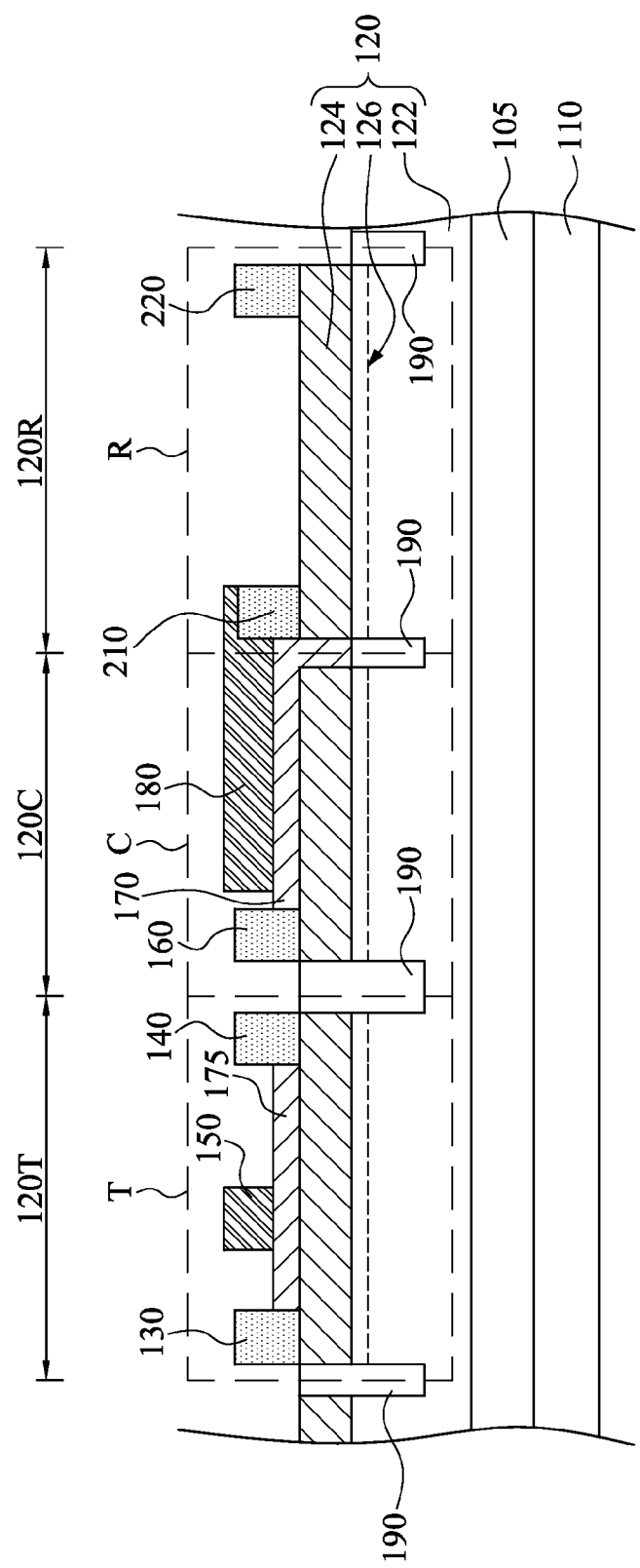
FIG. 2 is a cross-sectional view of a semiconductor device according to another embodiment of the present disclosure.

FIG. 2 is a cross-sectional view of a semiconductor device according to another embodiment of the present disclosure. The difference between FIGS. 1 and 2 is the presence of a resistor R. In this embodiment, the active layer 120 is further divided into a third portion 120R. The isolation portion 190 is further disposed between the third portion 120R and the first portion 120C. In some other embodiments, the isolation portion 190 can be disposed between the second portion 120T and the third portion 120R of the active layer 120 if the second portion 120T is disposed next to the third portion 120R. The semiconductor device further includes a resistor R disposed on the substrate 110 and electrically connected to the capacitor C. The resistor R includes the third portion 120R, a third electrode 210, and a fourth electrode 220. The third electrode 210 and the fourth electrodes 220 are electrically connected to the third portion 120R of the active layer 120. Hence, the transistor T, the capacitor C, and the resistor R of the present disclosure can form a circuit configuration.

In this embodiment, the first electrode 160, the source electrode 130, the drain electrode 140, the third electrode 210, and the fourth electrode 220 are made of substantially the same material. The first electrode 160, the source electrode 130, the drain electrode 140, the third electrode 210, and the fourth electrode 220 can be made of the same conductive layer, which then be patterned to form the first electrode 160, the source electrode 130, the drain electrode 140, the third electrode 210, and the fourth electrode 220. In some embodiments, the first electrode 160, the source electrode 130, the drain electrode 140, the third electrode 210, and the fourth electrode 220 can be respectively ohmic connected to the active layer 120, and the claimed scope of the present disclosure is not limited in this respect.

In this embodiment, the third electrode 210 is electrically connected to the second electrode 180 of the capacitor C. For example, the second electrode 180 is directly connected to the third electrode 210, such that the capacitor C and the resistor R form a series circuit. The third electrode 210 and the fourth electrode 220 are both disposed on the barrier layer 124. Therefore, the third electrode 210 and the fourth electrode 220 are spaced from the 2 DEG 126 of the third portion 120R. By apply a certain voltage, the 2 DEG 126 of the third portion 120R is connected to the third portion 210 and the fourth portion 220 to form the resistor R. The resistance of the resistor R depends on the conductivity among the 2 DEG 126, the third electrode 210, and the fourth electrode 220.

In summary, since in this embodiment, the first electrode 160, the source electrode 130, the drain electrode 140, the third electrode 210, and the fourth electrode 220 can be manufactured in the same manufacturing process (the first electrode 160, the source electrode 130, the drain electrode 140, the third electrode 210, and the fourth electrode 220 are substantially the same material), the transistor T, the capacitor C, and the resistor R can be formed without additional processes and the cost and the manufacturing time can be saved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure covers modifications and variations of this invention provided they fall within the scope of the following claims.

What is claimed is:

1. A semiconductor device comprising:
   a substrate;
   an active layer disposed on the substrate, the active layer is divided into a first portion and a second portion;
   a transistor disposed on the substrate, comprising:
      the second portion of the active layer;
      a source electrode and a drain electrode respectively and electrically connected to the second portion; and
      a gate electrode disposed on the second portion and disposed between the source electrode and the drain electrode; and
   a capacitor disposed on the substrate, comprising:
      the first portion of the active layer;
      a first electrode electrically connected to the first portion and the source electrode of the transistor;
      a first insulating layer disposed on the first portion; and
      a second electrode disposed on the first insulating layer and electrically connected to the gate electrode of the transistor;
      wherein the first electrode, the source electrode, and the drain electrode are made of substantially the same material, and the second electrode and the gate electrode are made of substantially the same material.

2. The semiconductor device of claim 1, wherein the first insulating layer is made of aluminum oxide.

3. The semiconductor device of claim 1, wherein the transistor further comprises:
   a second insulating layer disposed between the gate electrode and the second portion of the active layer.

4. The semiconductor device of claim 3, wherein the first insulating layer and the second insulating layer are made of substantially the same material.

5. The semiconductor device of claim 1, further comprising:
   an isolation portion disposed in the active layer and between the first portion and the second portion.

6. The semiconductor device of claim 1, wherein the active layer is further divided into a third portion, and the semiconductor device further comprises:
   a resistor disposed on the substrate and electrically connected to the capacitor, and the resistor comprising:
      the third portion of the active layer;
      a third electrode electrically connected to the third portion; and
      a fourth electrode electrically connected to the third portion.

7. The semiconductor device of claim 6, wherein the third electrode is connected to the second electrode of the capacitor.

8. The semiconductor device of claim 6, wherein the first electrode, the third electrode, and the fourth electrode are made of substantially the same material.

* * * * *